(12) United States Patent
Elian et al.

(10) Patent No.: US 6,251,558 B1
(45) Date of Patent: Jun. 26, 2001

(54) CHEMICALLY AMPLIFIED RESIST

(75) Inventors: Klaus Elian, Erlangen; Rainer Leuschner, Grossenseebach; Ewald Guenther, Herzogenaurach, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/065,010

(22) Filed: Apr. 23, 1998

(30) Foreign Application Priority Data

Apr. 23, 1997 (DE) .............................. 197 17 157

(51) Int. Cl.⁷ .............................. G06F 7/004; G03C 5/00
(52) U.S. Cl. .................... 430/270.1; 430/281.1; 430/915; 430/926; 430/170; 430/910; 430/296
(58) Field of Search .............................. 430/270.1, 281.1, 430/915, 926, 170, 910, 296

(56) References Cited

U.S. PATENT DOCUMENTS

| | | | | |
|---|---|---|---|---|
| 5,384,220 | * | 1/1995 | Sezi et al. | 430/313 |
| 5,525,453 | | 6/1996 | Przybilla et al. | |
| 5,624,787 | * | 4/1997 | Watanabe et al. | 430/270.1 |
| 5,633,409 | * | 5/1997 | Watanabe et al. | 568/49 |
| 5,759,739 | | 6/1998 | Takemura et al. | |
| 5,837,420 | * | 11/1998 | Aoai et al. | 430/270.1 |
| 5,851,733 | * | 12/1998 | Sezi et al. | 430/270.1 |
| 5,863,705 | * | 1/1999 | Sezi et al. | 430/311 |
| 5,876,899 | * | 3/1999 | Szmanda et al. | 430/270.1 |
| 5,891,603 | * | 4/1999 | Kodama et al. | 430/270.1 |
| 5,928,818 | * | 7/1999 | Mertesdorf et al. | 430/270.1 |
| 5,939,234 | * | 8/1999 | Yamanaka et al. | 430/270.1 |
| 6,037,098 | * | 3/2000 | Aoai et al. | 430/270.1 |
| 6,136,504 | * | 10/2000 | Tan et al. | 430/270.1 |
| B1 6,171,755 | * | 1/2001 | Elian et al. | 430/270.1 |

FOREIGN PATENT DOCUMENTS

WO 96/08751  3/1996 (WO).

OTHER PUBLICATIONS

Japanese Patent No. 63163845 A (abstract); "Resist Composition for forming fine patterns . . . ", Jul. 7, 1988.*
Lamola, A. et al., "Chemically Amplified Resists," Solid State Technology, vol. 34 (1991), No. 8, pp. 53–60.
MacDonald, S.A. et al., "Airborne Chemical Contamination of a Chemically Amplified Resist," Proceedings SPIE, vol. 1466 (1991), pp. 2–12.
Nalamasu, O. et al., "Preliminary Lithographic Characteristics of an All–organic Chemically Amplified Resist Formulation for Single Layer Deep–UV Lithography," Proceedings, SPIE, vol. 1466 (1991), pp. 13–25.
Paniez, P. et al., "Towards a Better Understanding of Positive Chemically Amplified Systems," Journal of Photopolymer Science and Technology, vol. 8 (1995), No. 4, pp. 643–652.

* cited by examiner

Primary Examiner—Hoa Van Le
Assistant Examiner—Yvette M. Clarke
(74) Attorney, Agent, or Firm—Herbert L. Lerner; Laurence A. Greenberg; Werner H. Stemer

(57) ABSTRACT

A chemically amplified resist contains the following components:
- a polymer with carboxylic acid anhydride groups and tert-butylester, tert-butoxycarbonyloxy, tetrahydrofuranyl, or tetrahydropyranyl groups;
- a photoreactive compound which, when exposed or electron-irradiated, releases a sulfonic acid having a $pK_a$ value>0.5 (acid former);
- a compound that can enter into a reversible chemical reaction with the sulfonic acid (buffer compound); and
- a solvent.

13 Claims, No Drawings

CHEMICALLY AMPLIFIED RESIST

FIELD OF THE INVENTION

The invention concerns a chemically amplified resist.

BACKGROUND OF THE INVENTION

In microelectronics, chemically amplified resists are used extensively for optical lithography and electron-beam writing (see "Solid State Technology," Vol. 34 (1991), no. 8, pages 53 to 60). Chemical amplification is utilized both for wet-developable single-layer resists and for entirely or partly dry-developable resists. In this context, the resists can operate on the principle of acid-catalyzed cleavage, wherein polar but blocked chemical groups, for example carboxyl groups or phenolic hydroxyl groups, are unblocked by means of a photolytically generated acid, and the resist changes polarity in the exposed regions. This change in polarity can be used, for example, to develop the resist in an alkaline developer or—in the case of dry-developable resists—for selective silylation. Examples of blocking groups are tert-butylester and tert-butoxycarbonyloxy groups.

U.S. Pat. No. 5,384,220 discloses a photolithographic pattern generation system in which a dry-developable resist is subjected, after exposure, to a thermal treatment (PEB= post exposure bake), then silylated from the liquid phase and then anisotropically etched or dry-developed in oxygen plasma. Depending on the type of silylation solution, positive or negative patterns (images) are produced. The resist generally consists of at least two solid constituents, i.e. a base polymer and a photoactive acid former. The base polymer contains carboxylic acid anhydride and tert-butylester partial structures, and the acid former is preferably an onium compound, such as diphenyliodonium and triphenylsulfonium trifluoromethanesulfonate. A resist of this kind is suitable in particular for photopatterning in the submicron and subsemimicron range with very steep slopes.

The "delay time effect" can be observed in a pattern generation procedure as outlined above—as with other known resist systems which operate on the principle of acid-catalyzed cleavage. Specifically, when the time span (delay time) between exposure and thermal treatment (PEB) exceeds a certain value, definite discrepancies then occur between the nominal pattern dimension (pattern size on the mask) and the pattern that is imaged (pattern size in the resist after development). The longer this delay time, the greater the discrepancies. Above a certain value for the delay time, for example about 30 minutes for anhydride-group-containing resists of the kind mentioned above, almost no patterns are recognizable after development. The tolerable delay time for these resists is approximately 5 to 10 minutes. For production-engineering reasons, however, such a short delay time cannot be accepted.

The aforesaid problem is commonly known, and is attributed to alkaline contamination in the air which deactivates the photochemically generated strong acid during the delay time. It is therefore proposed to solve this problem by filtering the air with active carbon (see "Proceedings, SPIE" Vol. 1466 (1991), pages 2 to 12). This requires large investments, however.

Even with other actions, for example by adding additives, it has not been possible to decisively attenuate the delay time effect (see "Proceedings, SPIE" Vol. 1466 (1991), pages 13 to 25). It is possible to extend the delay time by applying an additional layer, but only slightly. This action moreover constitutes an additional process step, which is, however, undesirable in production because it leads to yield losses.

For pattern dimensions<0.25 µm, which are becoming increasingly significant, diffusion of the photoacid generated by exposure, during the time period between exposure and PEB, is disruptive. The reason is that the acid diffuses from exposed to unexposed areas, so that those areas also become soluble; this, however, is undesirable. In addition, alkaline contaminants can diffuse into exposed areas and deactivate the photoacid there. The result of both effects, however, is that pattern dimensions which are on the order of the diffusion length can no longer be generated reliably.

The lateral diffusion effects cannot be reduced by any of the actions mentioned above. A reduction in diffusion can be accomplished by generating a denser polymer structure (as a result of an elevated temperature when evaporating the solvent from the resist solution) (see "Journal of Photopolymer Science and Technology" Vol. 8 (1995) No. 4, pages 643 to 652), but this action requires special polymers with a low glass transition temperature, and is therefore not generally applicable.

SUMMARY OF THE INVENTION

It is the object of the invention, in the case of chemically amplified anhydride-group-containing resists which offer the possibility of silylation from the liquid phase, to solve the delay time problem without additional process steps or investments, i.e. to increase the delay time between exposure or electron irradiation and thermal treatment from a value of approximately 10 minutes to a level acceptable in terms of production engineering, i.e. greater than or equal to 8 hours; at the same time, however, the resist is to allow high resolution and possess a high sensitivity (minimum exposure or irradiation dose and lowest possible PEB temperature).

According to the invention, this is achieved in that the resist contains the following components:

- a polymer with carboxylic acid anhydride groups and tert-butylester, tert-butoxycarbonyloxy, tetrahydrofuranyl, or tetrahydropyranyl groups;
- a photoreactive compound which, when exposed or electron-irradiated, releases a sulfonic acid having a $pK_a$ value>0.5 (acid former);
- a compound that can enter into a reversible chemical reaction with the sulfonic acid (buffer compound); and
- a solvent.

Advantageously, especially for exposure, the resist further contains a sensitizer which causes an increase in light yield or electron yield.

The invention achieves the object in terms of the delay time by means of the following interlinked features:

1. For the resist (based on polymers of the kind cited above), what is used as acid former is a photoreactive compound from which a relatively weak sulfonic acid ($pK_a$>0.5 to 4) is released, for example benzenesulfonic acid ($pK_a$=0.70) and toluenesulfonic acid ($pK_a$=1.55), where $pK_a$ is the "acid exponent" (negative common logarithm of the acid constant $K_a$). An acid of this kind has the advantage that it is relatively insensitive to alkaline contaminants, and that its vapor pressure and mobility are much lower than in the case of the trifluoromethanesulfonic acid which is otherwise often used ($pK_a$=−5.9).

2. The resist contains a "buffer compound." This is a compound which can enter into a reversible chemical reaction, i.e. an acid-base equilibrium reaction, with the sulfonic acid formed upon exposure or electron irradiation. The buffer compound intercepts a portion of the acid, and gives up protons again in the event that bases diffuse in.

3. Advantageously, the resist also contains a sensitizer. This prevents the resist sensitivity from becoming too low as a result of the relatively weak acid and the effect of the buffer compound as acid interceptor, since the sensitizer increases light yield or interaction with the electron beams. In the case of a two-layer resist or "TSI" (top surface imaging) resist, light absorption may moreover be higher than in the case of a standard single-layer resist, since only a very thin layer needs to be exposed.

As a result of the aforesaid features—special acid former, buffer compound, and optionally sensitizer—the resist according to the invention, which is a positive resist, exhibits good sensitivity (<10 mJ/cm$^2$ at PEB temperatures<=100° C.) while being highly insensitive to alkaline contaminants from the atmosphere, which constitute a principal cause of the delay time effect. The delay time is thus increased to 24 hours or more.

WO 96/08751 discloses a method for photolithographic pattern generation that operates, among others, on the basis of the two-layer resist method. A wet-developable top resist is used in this, based on a polymer which has carboxylic acid anhydride groups and tert-butylester or tert-butoxycarbonyloxy groups. In addition to the polymer, the resist contains a photoactive component in the form of an ester of a naphthoquinonediazide-4-sulfonic acid with an aromatic hydroxy compound of a specific structure. As compared with this resist, the resist according to the invention has a higher sensitivity, i.e. the energy necessary upon exposure is less, and the PEB step takes place at lower temperatures (8 mJ/cm$^2$ at 100° C., compared to 19 mJ/cm$^2$ at 140° C.). In addition, the delay time is considerably extended (from 16 hours to at least 24 hours), which also applies, in particular, to smaller patterns (<0.4 μm).

DETAILED DESCRIPTION OF THE INVENTION

The resist according to the invention is based on a polymer which has—in addition to anhydride groups—tert-butylester, tert-butoxycarbonyloxy, tetrahydrofuranyl, or tetrahydropyranyl groups. Preferred in this context are those polymers whose carboxylic acid anhydride groups derive from maleic anhydride. Another compound of this kind is, for example, itaconic acid anhydride. The tert-butylester groups are preferably based on the tert-butylester of acrylic acid, methacrylic acid, vinylbenzoic acid, or cinnamic acid, the tert-butoxycarbonyloxy groups preferably on tert-butoxycarbonyloxystyrene or -maleinimide. In addition to copolymers, terpolymers can also be used in the resist, for example terpolymers of maleic anhydride, methacrylic acid tert-butylester, and methacrylic acid (as the third component).

Photoreactive compounds which release a weak sulfonic acid serve as the acid formers. These are advantageously the following compounds: sulfonates, in particular of aromatic sulfonic acids, with a diphenyliodonium or triphenylsulfonium cation, disulfones and diazodisulfones, and sulfonic acid esters, in particular esters of aromatic sulfonic acids, such as toluenesulfonic acid, with hydroxyimides, i.e. compounds such as n-sulfonyloxymaleinimides, -phthalimides, and -naphthalimides. Compounds such as N-sulfonyloxymaleinimides can also be incorporated into the polymer, thus preventing any potential demixing of polymer and acid former. The acid former can also contain covalently bonded iodine.

Quaternary ammonium compounds with a sulfonate anion (R—SO$_3^-$) are, advantageously, suitable as the buffer compound. Quaternary ammonium compounds, i.e. organic ammonium compounds with a quaternary nitrogen atom, are based on tertiary amines. In the present case these are, for example, trimethylamine, dimethylethylamine, methyldiethylamine, triethylamine, N,N-dimethylaniline, and pyridine. The sulfonate anion is preferably derived from benzene-, toluene-, naphthalene-, cyclohexane-, or camphorsulfonic acid. Buffer compounds of this kind are, for example, salts of toluenesulfonic acids with tertiary amines, such as tetramethylammonium and tetraethylammonium tosylate.

Preferred sensitizers are, for exposure, carboxylic acids or esters of polycyclic aromatic hydrocarbons, i.e. aromatic compounds with condensed ring systems, or compounds having phenolic OH groups and protective groups; and, for electron irradiation, aromatic compounds with covalently bonded atoms with a high atomic number, such as iodine. Advantageously, the sensitizer has a protected alkaline-soluble group which is cleaved by acid catalysis in the exposed or irradiated areas, causing the sensitizer to become soluble in alkaline developers. The sensitizer can also be incorporated into the polymer; in this case an alkaline-soluble group is not necessary.

For optical exposure, the following aromatic compounds are advantageously suitable as the sensitizer: 9-fluorenecarboxylic acid, 9-fluorenecarboxylic acid tert-butylester, methoxynaphthylpropionic acid tert-butylester, and xanthene-9-carboxylic acid tert-butylester, as well as dihydroxynaphthalene or bisphenol A having tetrahydropyranyl or tert-butoxycarbonyloxy protective groups. For electron-beam writing, aromatic compounds with covalently bonded iodine are advantageously suitable as the sensitizer. These are, for example, low-molecular-weight compounds such as iodanisole and triiodophenol.

Resist solvents known per se may be used as the solvent. Preferably the solvent is methoxypropyl acetate or a mixture of γ-butyrolactone and cyclohexanone, in particular at a volume ratio of approximately 1:2. Further suitable solvents are, for example, cyclopentanone and cyclohexanone, or ethylene glycol ether or diethylene glycol ether, optionally mixed with dibenzyl ether.

The resist according to the invention generally has the following composition, the individual components adding up to 100%: 5 to 9 wt % polymer, 0.2 to 1 wt % acid former, 0.1 to 0.5 wt % buffer compound, and 85 to 94 wt % solvent, as well as optionally 0.2 to 1 wt % sensitizer. In this context, the weight ratio between acid former and sensitizer is preferably approximately 1:1.

The resist can be used in both single-layer and two-layer processes. Two-layer processes are preferred, however, because of the better resolution capability and in order to eliminate substrate reflections. The resist can be exposed with UV radiation at a wavelength<=300 nm (DUV), or irradiated with electrons at an acceleration voltage in the range from approximately 5 to 50 kV.

The invention will be explained in further detail with reference to exemplary embodiments (p/w=parts by weight).

EXAMPLE 1

(Exposure in DUV range)

A resist solution of the following composition was used: 7.5 p/w of a copolymer of maleic anhydride and methacrylic acid tert-butylester (at a 50:50 molar ratio) with a molecular weight of approx. 3000 g/mol (produced by radical polymerization), 1 p/w of the ester of N-hydroxyphthalimide with toluenesulfonic acid (as acid former), 0.5 p/w tetraethylammonium tosylate (as buffer compound), 1 p/w 9-fluorenecarboxylic acid (as sensitizer), and 90 p/w 1-methoxy-2-propyl acetate (as solvent). The resist solution was spin-coated onto a silicon wafer (rotation speed: 3000 rpm) which was equipped with a 1.5 µm thick baked novolak layer (220° C./30 minutes in recirculating air oven) as bottom resist; it was then predried (120° C./60 sec) on a hot plate. The film thickness of the top resist thus produced was 250 nm. The top resist was then exposed through a gray-scale mask (Multi-Density Resolution Target/Ditric Optics) on a mask aligner under vacuum contact (MJB 3/Süss KG with UV-M interference filter/Schott) using UV radiation at 249 nm and, after a delay time T, dried (PEB) on a hot plate at 100° C./120 sec. In the process, the tert-butylester groups were cleaved off, catalyzed by the photolytically formed acid. Development (90 seconds in a Puddle unit/Hamatech) with an aqueous alkaline developer (NMD-W, 2.38%/Tokyo Ohka) yielded a positive image of the mask.

Since the mask had areas of different transmissions, it was possible to determine the light dose (Dp(0) dose) at which the resist was just completely developed, i.e. no further residual film thickness could be measured. The Dp(0) dose determined in this fashion (8 mJ/cm$^2$) proved, within the measurement accuracy (±1 mJ/cm$^2$), to be independent of a delay time T of 24 hours. The Dp(0) dose correlated in inverse proportion with the line or space width (CD), measured in the resist after development, using projection exposure (wafer stepper) at a defined exposure dose. A dose variation of 20% caused a variation of no more than 0.1 µm in the lines and spaces. As a result, a fluctuation in the Dp(0) dose of a maximum of 11%, which is possible within the error limits, cannot cause any appreciable fluctuation in the line width, as it is often described.

After wet development, the top resist was treated for 120 seconds with a silylation solution in the form of a 2% solution of a diaminopropyl-dimethylsiloxane oligomer (Tegomer A-Si 1020/Goldschmidt) in a mixture of ethanol and 2-propanol (volume ratio 1:2); as a result, the film thickness of the resist increased by 95 nm. A rinse with pure 2-propanol for 20 seconds then followed, and the silicon wafer was then placed in a plasma etching unit (MIE 720/Material Research Corporation). At an RF output of 900 W (bias voltage=45 V) and an oxygen flow of 30 sccm (pressure=3 µbar), the patterns were transferred into the bottom resist; etching time was 45 seconds (35% overetch).

EXAMPLE 2
(Electron-Beam Writing)

A resist solution of the following composition was used: 8.9 p/w of a terpolymer of maleic anhydride, methacrylic acid tert-butylester, and methacrylic acid (at a 50:40:10 molar ratio), with a molecular weight of approx. 3000 g/mol (produced by radical polymerization), 1 p/w of the ester of N-hydroxyphthalimide with p-iodobenzenesulfonic acid (as acid former), 0.1 p/w tetraethylammonium tosylate (as buffer compound), 1 p/w 9-fluorenecarboxylic acid (as sensitizer), and 90 p/w 1-methoxy-2-propyl acetate (as solvent). The resist solution was spin-coated onto a silicon wafer (rotation speed: 3000 rpm) which was equipped with a 0.5 Am thick baked novolak layer (220° C./45 minutes in recirculating air oven) as bottom resist; it was then predried (120° C./60 sec) on a hot plate. The film thickness of the resulting top resist was 250 nm. The resist was then irradiated with electrons using an electron beam writer (HL 700/Hitachi) at an acceleration voltage of 30 kV and, after a delay time T, dried (PEB) on a hot plate at 130° C./120 sec.

In the process, the tert-butylester groups were cleaved off, catalyzed by the photolytically formed acid. Development (40 seconds in a Puddle unit/Hamatech) with an aqueous alkaline developer (NMD-W, 1.19%, with 1% methylbenzylamine added/Tokyo Ohka) yielded the pattern that had been written.

Electron beam writing can irradiate different areas directly with different doses, allowing the Dp(0) dose to be determined. The Dp(0) dose determined in this fashion (7 µC/cm$^2$) proved, within the measurement accuracy (±1 µC/cm$^2$), to be independent of a delay time T of 24 hours. The Dp(0) dose correlated in inverse proportion with the line or space width (CD), measured in the resist after development, for electron exposure at a defined dose. A dose variation of 20% effected a variation of no more than 0.1 µm in the lines and spaces. As a result, a fluctuation in the Dp(0) dose of a maximum of 11%, which is possible within the error limits, cannot cause any appreciable fluctuation in the line width, as it is often described.

After wet development, a procedure corresponding to that in Example 1 was followed.

Instead of the aforementioned resist, the resist according to Example 1 can also be used. The resulting buffer effect is the same.

What is claimed is:

1. A chemically amplified resist, comprising
   a) a polymer, comprising
      carboxylic acid anhydride groups, and
      tert-butylester, tert-butoxycarbonyloxy, tetrahydrofuranyl, or tetrahydropyranyl groups;
   b) a photoreactive compound which, when exposed to light or irradiated with electrons, releases a sulfonic acid having a pK$_a$ value>0.5;
   c) a quaternary ammonium compound having a sulfonate anion, the compound being able to enter into a reversible chemical reaction with the sulfonic acid; and
   d) a solvent;
   wherein the tolerable delay time for the chemically amplified resist is at least 24 hours.

2. The resist according to claim 1 further comprising a sensitizer which causes an increase in light yield or electron yield.

3. The resist according to claim 2, wherein the weight ratio of the photoreactive compound to the sensitizer is approximately 1:1.

4. The resist according to claim 2, wherein the photoreactive compound is a sulfonate, disulfone, diazodisulfone, or sulfonic acid ester.

5. The resist according to claim 2, wherein the solvent is methoxypropyl acetate or a mixture of γ-butyrolactone and cyclohexanone.

6. The resist according to claim 2, wherein the sensitizer is a carboxylic acid or an ester of a polycyclic aromatic hydrocarbon, or a compound having protective groups and phenolic OH groups.

7. The resist according to claim 3, wherein the photoreactive compound is a sulfonate, disulfone, diazodisulfone, or sulfonic acid ester.

8. The resist according to claim 3, wherein the sensitizer is a carboxylic acid or an ester of a polycyclic aromatic hydrocarbon, or a compound having protective groups and phenolic OH groups.

9. The resist according to claim 3, wherein the sensitizer is an aromatic compound with covalently bound iodine.

10. The resist according to claim 1, wherein the photoreactive compound is a sulfonate, disulfone, diazodisulfone, or sulfonic acid ester.

11. The resist according to claim 1, wherein the solvent is methoxypropyl acetate or a mixture of γ-butyrolactone and cyclohexanone.

12. The resist according to claim 1, wherein the sulfonate anion is derived from benzenesulfonic acid, toluenesulfonic acid, naphthalenesulfonic acid, cyclohexanesulfonic acid, or camphorsulfonic acid.

13. A chemically amplified resist, comprising:
   a) a polymer, comprising carboxylic acid anhydride groups, and tert-butylester, tert-butoxycarbonyloxy, tetrahydrofuranyl, or tetrahydropyranyl groups;
   b) a photoreactive compound which, when exposed to light or irradiated with electrons, releases a sulfonic acid having a $pK_a$ value>0.5;
   c) a compound that can enter into a reversible chemical reaction with the sulfonic acid;
   d) a solvent; and
   e) a sensitizer which causes an increase in light yield or electron yield, wherein the sensitizer is an aromatic compound with covalently bound iodine.

* * * * *